United States Patent
Bao

(10) Patent No.: US 10,356,954 B2
(45) Date of Patent: Jul. 16, 2019

(54) CABINET STRUCTURE AND CONTAINER DATA CENTER THEREOF

(71) Applicant: Huawei Technologies Co., Ltd., Shenzhen (CN)

(72) Inventor: Yu Bao, Chengdu (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 425 days.

(21) Appl. No.: 14/984,681

(22) Filed: Dec. 30, 2015

(65) Prior Publication Data

US 2016/0113157 A1  Apr. 21, 2016

Related U.S. Application Data

(63) Continuation of application No. PCT/CN2014/084011, filed on Aug. 8, 2014.

(30) Foreign Application Priority Data

Oct. 30, 2013 (CN) .......................... 2013 1 0529498

(51) Int. Cl.
H05K 7/20 (2006.01)
A47B 53/00 (2006.01)
A47B 81/00 (2006.01)

(52) U.S. Cl.
CPC ......... H05K 7/20736 (2013.01); A47B 53/00 (2013.01); A47B 81/00 (2013.01); H05K 7/20745 (2013.01)

(58) Field of Classification Search
CPC ............ H05K 7/20736; H05K 7/20745; A47B 53/00; A47B 81/00

USPC .......................................................... 454/184
See application file for complete search history.

(56) References Cited

U.S. PATENT DOCUMENTS

| 8,331,087 B2* | 12/2012 | Wei ................... | H05K 7/20745 174/520 |
| 8,659,895 B1* | 2/2014 | Carlson .............. | H05K 7/20745 361/694 |
| 2012/0142265 A1* | 6/2012 | Wei ................... | H05K 7/20745 454/184 |

FOREIGN PATENT DOCUMENTS

| CN | 2922386 Y | 7/2007 |
| CN | 103561555 A | 2/2014 |
| JP | 2011133950 A | 7/2011 |

(Continued)

OTHER PUBLICATIONS

Partial English Translation and Abstract of Chinese Patent Application No. CN103561555, Oct. 30, 2015, 4 pages.

(Continued)

Primary Examiner — Gregory L Huson
Assistant Examiner — Dana Tighe
(74) Attorney, Agent, or Firm — Conley Rose, P.C.

(57) ABSTRACT

A cabinet structure, in which an electronic apparatus is placed, where the cabinet structure includes a base and two cabinets, the base includes a first side face, a second side face, and a third side face, there is an included angle separately between the second side face and the first side face and between the third side face and the first side face, the base is fastened using the first side face, the cabinets are installed on and fastened to the second side face and the third side face respectively, and the two cabinets are arranged in a V shape and form an angle. A container data center using the cabinet structure is further provided.

16 Claims, 4 Drawing Sheets

(56) References Cited

FOREIGN PATENT DOCUMENTS

JP          2014127022  A      7/2014

OTHER PUBLICATIONS

Partial English Translation and Abstract of Chinese Patent Application No. JP2011133950, Oct. 30, 2015, 11 pages.
Partial English Translation and Abstract of Chinese Patent Application No. JP2014127022, Oct. 30, 2015, 12 pages.
Foreign Communication From a Counterpart Application, PCT Application No. PCT/CN2014/084011, English Translation of International Search Report dated Oct. 22, 2014, 2 pages.
Foreign Communication From a Counterpart Application, PCT Application No. PCT/CN2014/084011, Written Opinion dated Oct. 22, 2014, 6 pages.

\* cited by examiner

CABINET STRUCTURE AND CONTAINER DATA CENTER THEREOF

CROSS-REFERENCE TO RELATED APPLICATION

This application is a continuation of International Application No. PCT/CN2014/084011, filed on Aug. 8, 2014, which claims priority to Chinese Patent Application No. 201310529498.6, filed on Oct. 30, 2013, both of which are incorporated herein by reference in their entireties.

TECHNICAL FIELD

The present disclosure relates to computer and network technologies, and in particular, to a cabinet structure and a container data center using the cabinet structure.

BACKGROUND

Currently, a cabinet is used as an apparatus for housing a computer, a server, a storage device, and a relevant control device. The cabinet may provide protection for the housed devices and shield electromagnetic interference, so that the server, the storage device, and a relevant electronic device run in a favorable environment. Because electronic devices in a cabinet are mostly assembled and arranged in a centralized manner, these electronic devices generate a great amount of heat when running. In order to dissipate the heat during running, these electronic devices are mostly provided with separate fans to dissipate hot air that is inside the electronic devices.

When the computer, the server, the storage device, and the relevant electronic device are running, the fans installed on these electronic devices rotate at a high speed. However, when dissipating the heat that is inside the foregoing devices, these fans bring negative impact on disks of the electronic devices such as the computer, the server, and the storage device, the main reason being that the disks are in a high-speed rotating state when working, and vibrations generated by these fans by means of high-speed rotation are directly transmitted to the disks, leading to reduction in reliability, a life span, and read and write performance of the disks. In addition, these fans are vulnerable parts, have a short life span, and need to be frequently replaced. When any one of many fans in a cabinet is damaged, the cabinet needs to be disassembled for replacement or maintenance in time, which increases maintenance costs.

SUMMARY

A technical problem is solved in embodiments of the present disclosure as follows. A simple cabinet structure is provided, which not only facilitates fast cooling of internal electronic apparatuses such as a computer, a server, and a storage device but also reduces impact of vibrations generated by a cooling fan on read and write performance of disks in the electronic apparatuses such as the computer, the server, and the storage device.

In addition, the present disclosure further provides a container data center using the foregoing cabinet structure.

To solve the foregoing technical problem, the present disclosure provides a cabinet structure, in which an electronic apparatus is placed, where the cabinet structure includes a base and two cabinets, the base includes a first side face, a second side face, and a third side face, there is an included angle separately between the second side face and the first side face and between the third side face and the first side face, the base is fastened using the first side face, the cabinets are installed on and fastened to the second side face and the third side face respectively, and the two cabinets are arranged in a V shape and form an angle.

The base is made of a metal material, the base is triangular prism-shaped on the whole, and a cross section of the base is a triangle.

The base is made of a metal material, the base is triangular prism-shaped on the whole, a cross section of the base is an isosceles triangle, and areas of the second side face and the third side face are equal.

The cabinet includes several installation frames, the installation frames are successively installed and fastened together to form the cabinet, and the installation frame is configured to hold the electronic apparatus.

The present disclosure further provides a container data center, in which an electronic apparatus is placed, where the container data center includes a container, several cooling fans, and a cabinet structure, the cooling fans are installed on the top of the container, and the cabinet structure is installed in the container, where the cabinet structure includes a base and two cabinets, the base includes a first side face, a second side face, and a third side face, there is an included angle separately between the second side face and the first side face and between the third side face and the first side face, the base is fastened to the bottom of the container using the first side face, the cabinets are installed on the second side face and the third side face respectively, the cabinets are arranged in a V shape and form an angle, and an air flow channel is formed between the cabinet and the container.

The container includes a top wall, a bottom wall, and side walls, the top wall and the bottom wall are parallel to each other, the side walls are located between the top wall and the bottom wall, and are connected to the top wall and the bottom wall separately, the cooling fans are all installed on the top wall, the base is fastened to the bottom wall of the container using the first side face, the cabinet is in contact with and is supported by the side wall of the container, and an air flow channel is formed between the cabinet and the side wall of the container.

The container is placed on a raised floor, the raised floor is provided with an air outlet, the bottom wall is provided with several openings, the openings are aligned with the air outlet on the raised floor, and cold air enters the container through the air outlet and the openings.

The container is placed on a floor, the side wall of the container is provided with several air vents, the air vent is configured to be passed through and passed out by cold air, and the cold air enters the container through the air vents.

The base is made of a metal material, the base is triangular prism-shaped on the whole, and a cross section of the base is a triangle.

The base is made of a metal material, the base is triangular prism-shaped on the whole, a cross section of the base is an isosceles triangle, and areas of the second side face and the third side face are equal.

The cabinet includes several installation frames, the installation frames are successively installed and fastened together to form the cabinet, and the installation frame is configured to hold the electronic apparatus.

In conclusion, in the container data center provided by the embodiments of the present disclosure, the cooling fans are all placed on the top wall of the container instead of installing a cooling fan on each electronic apparatus in the container, which not only simplifies design to directly reduce production costs and maintenance costs but also reduces impact of vibrations generated by the cooling fans on disks in the electronic apparatuses, thereby further effectively prolonging a life span and improving read and write performance of the disks. In addition, the cabinet of the cabinet structure is installed on and fastened to the bottom wall of the container. The obliquely installed cabinet and the bottom wall form an included angle, and an air flow channel is formed between the cabinet and the side wall of the container, so as to facilitate air circulation and emission of hot airflow. The cooling fans dissipate heat inside the container to an external environment.

BRIEF DESCRIPTION OF DRAWINGS

To describe the technical solutions in the embodiments of the present disclosure more clearly, the following briefly introduces the accompanying drawings required for describing the embodiments.

DESCRIPTION OF EMBODIMENTS

The following clearly describes the technical solutions in the embodiments of the present disclosure with reference to the accompanying drawings in the embodiments of the present disclosure. The described embodiments are merely some but not all of the embodiments of the present disclosure. All other embodiments obtained by a person of ordinary skill in the art based on the embodiments of the present disclosure without creative efforts shall fall within the protection scope of the present disclosure.

Figure 1:
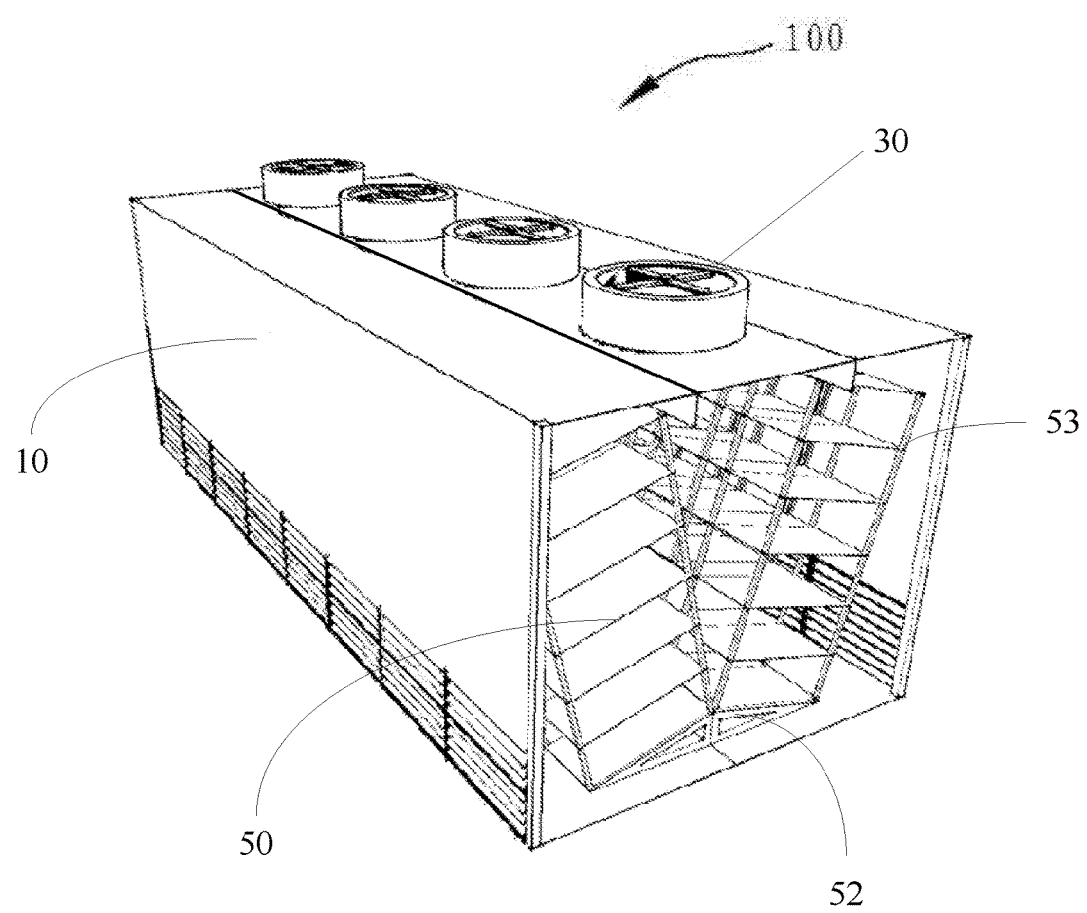
FIG. 1 is a schematic three-dimensional diagram of a container data center according to an embodiment of the present disclosure.

Referring to FIG. 1, a container data center 100 is provided in an exemplary embodiment of the present disclosure, in which electronic apparatuses such as a computer, a server, and a storage device are installed. The container data center 100 includes a container 10, several cooling fans 30, and a cabinet structure 50. The cooling fan 30 is detachably installed on the container 10, and is configured to dissipate or conduct heat that is inside the container 10; the cabinet structure 50 is detachably installed in the container 10, and is configured to house the electronic apparatuses such as the computer, the server, and the storage device. The cabinet structure 50 can provide protection for the housed electronic apparatuses and shield electromagnetic interference, so as to ensure that the electronic apparatuses such as the computer, the server, and the storage device can run in a favorable environment.

In this embodiment of the present disclosure, the container data center 100 may further include electronic apparatuses such as a battery cabinet, an air conditioning system, a switch, a heat exchanger, and a bus line. The electronic apparatuses such as the battery cabinet, the air conditioning system, the switch, the heat exchanger, and the bus line are installed in the container 10, and perform their respective functions during running of the container data center 100.

Figure 2:
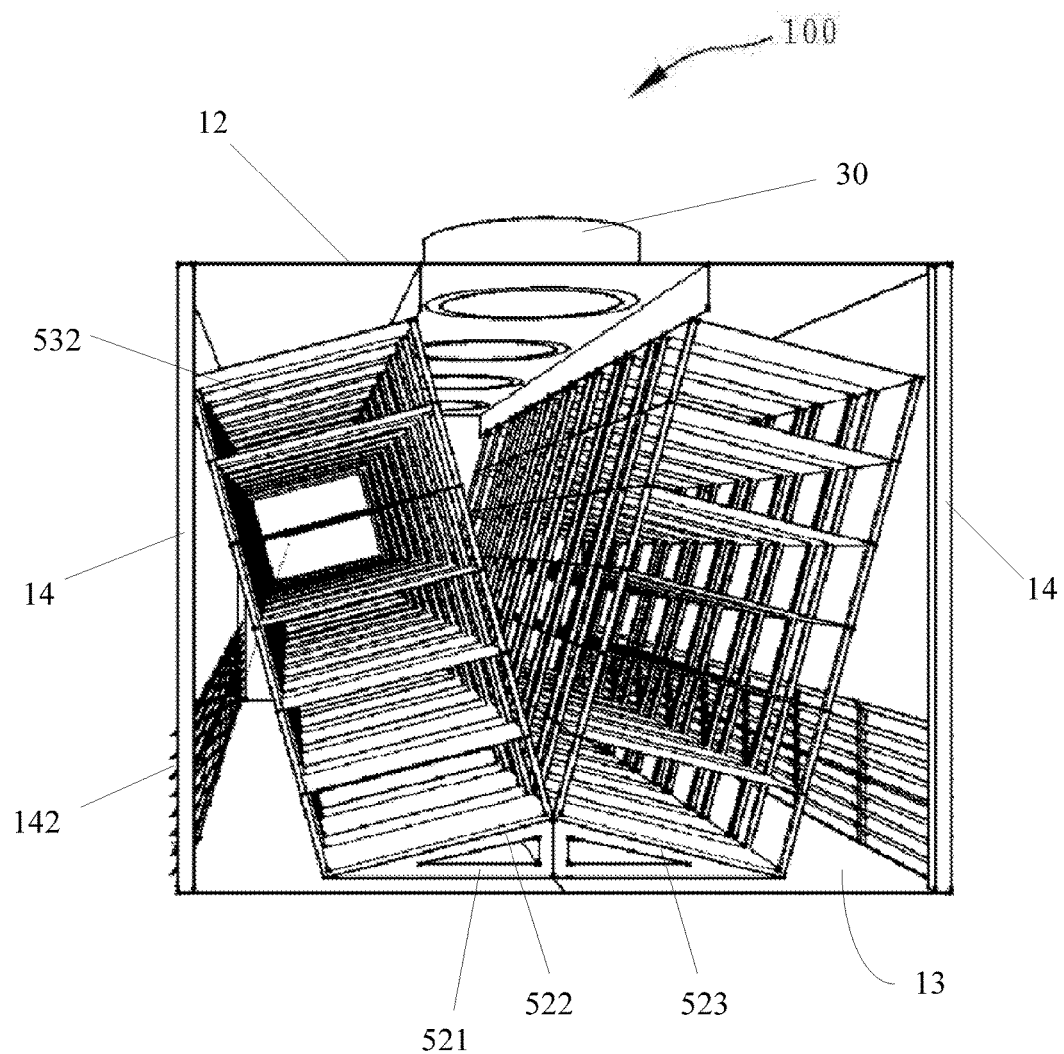
FIG. 2 is a schematic three-dimensional diagram, from another perspective, of the container data center shown in FIG. 1.

Also referring to FIG. 2, in this embodiment of the present disclosure, the container 10 is roughly cuboid-shaped on the whole, and may be a light material container. The container 10 includes a top wall 12, a bottom wall 13, and four side walls 14. Both the top wall 12 and the bottom wall 13 are in cuboid plate shapes on the whole, and the two are parallel to each other. The side walls 14 are located between the top wall 12 and the bottom wall 13, and are separately connected to edges of the top wall 12 and the bottom wall 13, so as to form the cuboid-shaped container 10 in an enclosing manner. The cooling fans 30 are installed on the top wall 12.

Figure 3:
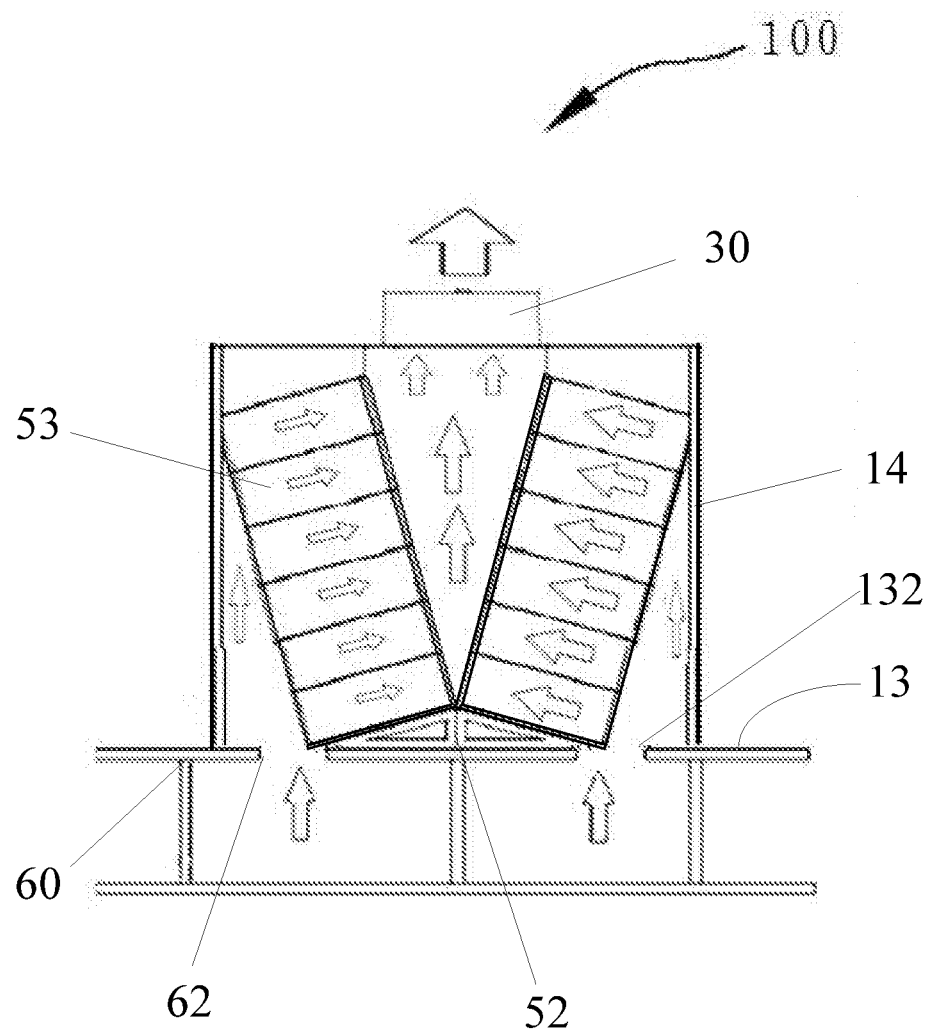
FIG. 3 is a schematic diagram showing a status in which a container data center is installed on a raised floor according to an embodiment of the present disclosure.

Also referring to FIG. 3, in an embodiment of the present disclosure, the container 10 is placed on a raised floor 60, the raised floor 60 is provided with an air outlet 62, and the air outlet 62 is configured to be passed through and passed out by cold air. The bottom wall 13 is provided with several openings 132, and the openings 132 are aligned with the air outlet 62 on the raised floor 60. Cold air provided by the air conditioning system or an external environment enters the container 10 through the air outlet 62 and the openings 132, so as to cool the electronic apparatuses such as the computer, the server, and the storage device that are installed in the cabinet structure 50; then, the cooling fans 30 dissipate the heat that is inside the container 10.

Figure 4:
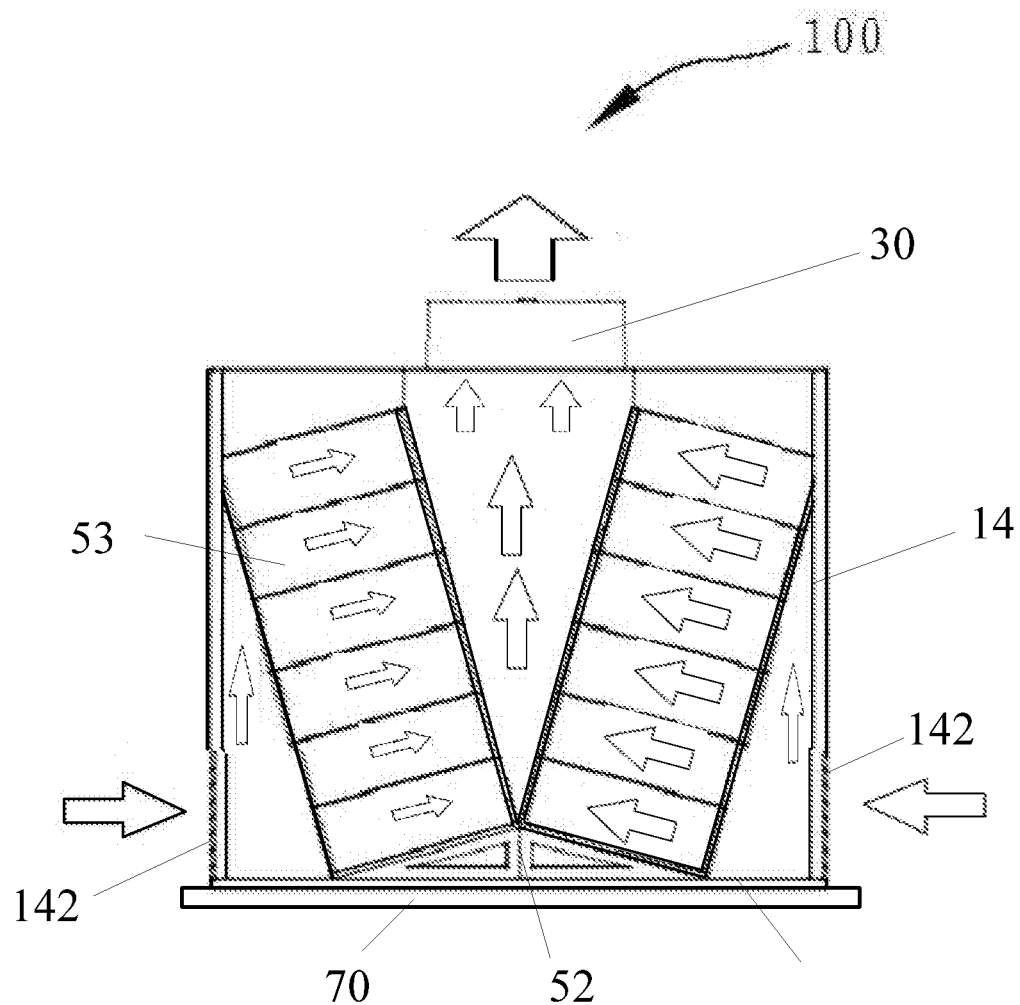
FIG. 4 is a schematic diagram showing a status in which a container data center is installed on a non-raised floor according to another embodiment of the present disclosure.

Also referring to FIG. 4, in another embodiment of the present disclosure, the container 10 may be used on a common indoor floor or be used outdoors, and is placed on a common floor (hard floor) 70. The side wall 14 of the container 10 is provided with several air vents 142, and the air vents 142 are configured to be passed through and passed out by cold air. The cold air provided by the air conditioning system or the external environment enters the container 10 through the air vents 142, so as to cool the electronic apparatuses such as the computer, the server, and the storage device that are installed in the cabinet structure 50; then, the cooling fans 30 conduct the heat inside the container 10 to the external environment.

The several cooling fans 30 are detachably installed on an upper part of the container 10, and are configured to dissipate the heat inside the container 10 to the external environment. The cooling fans 30 are detachably installed on the top wall 12 of the container 10, and can dissipate, when the cooling fans 30 are working, heat that is generated by the electronic apparatuses such as the computer, the server, and the storage device in the container 10 to the external environment. Therefore, the cooling fans 30 are all placed on the top wall 12 of the container 10 instead of installing a cooling fan on each electronic apparatus such as the computer and the server, which not only simplifies design to directly reduce production costs and maintenance costs but also reduces impact of vibrations generated by the cooling fans 30 on disks in the electronic apparatuses such as the computer, the server, and the storage device, thereby further effectively prolonging a life span and improving read and write performance of the disks.

The cabinet structure 50 is detachably installed in the container 10, and is configured to house the electronic apparatuses such as the computer, the server, and the storage device. In this embodiment of the present disclosure, the cabinet structure 50 includes a base 52 and two cabinets 53, and the cabinets 53 are detachably installed on the base 52. It may be understood that in another embodiment of the present disclosure, a quantity of cabinets 53 is not limited to 2, and may also be 3, 4, 5, 6, or another quantity.

In an embodiment of the present disclosure, the base 52 may be made of a metal material, and is roughly triangular prism-shaped on the whole; a cross section of the base 52

(that is, a bottom face of the base 52) is a triangle. The base 52 is detachably installed on and fastened to the bottom of the container 10 in a manner, such as a screw connection, a bolt connection, or a buckle connection. That is, one side face of the base 52 is detachably installed on and fastened to the bottom wall 13 of the container 10 in the manner, such as the screw connection, the bolt connection, or the buckle connection. The two cabinets 53 are detachably installed on and fastened to the other two side faces of the base 52, and the two cabinets 53 form an included angle.

In an exemplary embodiment of the present disclosure, the base 52 is triangular prism-shaped on the whole, and a cross section of the base 52 (that is, a bottom face of the base 52) is an isosceles triangle. The base 52 includes three side faces (that is, a first side face 521, a second side face 522, and a third side face 523 that are successively connected and that are shown in FIG. 2), and areas of two side faces (that is, the second side face 522 and the third side face 523) thereof are equal. One side face (that is, the first side face 521) of the base 52 is detachably installed on and fastened to the bottom wall 13 of the container 10 in a manner, such as a screw connection, a bolt connection, or a buckle connection. The two cabinets 53 are detachably installed on and fastened to the two side faces, with the equal area, of the base 52, and the two cabinets 53 form an included angle, thereby forming a structure in a "V" shape. An included angle between the cabinet 53 and the bottom wall 13 of the container 10 is roughly equal to a base angle of the cross section (that is, an included angle between the second side face 522 and the first side face 521 or between the third side face 523 and the first side face 521), and the included angle between the two cabinets 53 is roughly equal to a sum of two base angles of the cross section.

The cabinet 53 is roughly a frame structure in a cuboid shape on the whole, and the cabinet 53 includes several installation frames 532, where the installation frames 532 are successively fastened together in a manner, such as a screw connection, a buckle connection, or a mortise lock connection, so as to form the cabinet 53. The installation frame 532 is configured to hold the electronic apparatuses such as the computer, the server, and the storage device, and can provide protection for the stored apparatuses and shield electromagnetic interference, so as to ensure that the electronic apparatuses such as the computer, the server, and the storage device may run in a favorable environment.

Also referring to FIG. 1 to FIG. 4, in this embodiment of the present disclosure, during assembly, the cabinets 53 are assembled in a pair in a back-to-back manner to form a structure in a "V" shape. The cabinet 53 is in contact with and is supported by an inner surface of the side wall 14 of the container 10, and an air flow channel is formed between the cabinet 53 and the side wall 14 of the container 10. The cold air provided by the air conditioning system or the external environment enters the container 10 through the air vents 142 of the side wall 14 or the openings 132 of the bottom wall 13, such that a cold airflow channel is formed between the cabinet 53 and the side wall 14 of the container 10. Cold airflow becomes hot airflow after passing through the electronic apparatuses such as the computer, the server, and the storage device. Because the inclined cabinets 53 and the electronic apparatuses such as the computer, the server, and the storage device installed on the cabinets 53 encounter relatively low wind resistance, the inclined cabinets 53 that are assembled in the back-to-back manner are more beneficial for air circulation and emission of hot airflow. Finally, the cooling fans 30 dissipate the heat inside the container 10 to the external environment.

In conclusion, in the container data center 100 provided by the embodiments of the present disclosure, the cooling fans 30 are all placed on the top wall 12 of the container 10 instead of installing a cooling fan on each electronic apparatus in the container 10, which not only simplifies design to directly reduce production costs and maintenance costs but also reduces impact of vibrations generated by the cooling fans 30 on disks in the electronic apparatuses, thereby further effectively prolonging a life span and improving read and write performance of the disks. In addition, the cabinet 53 of the cabinet structure 50 is installed on and fastened to the bottom wall 13 of the container 10. The obliquely installed cabinet 53 and the bottom wall 13 form an included angle, and an air flow channel is formed between the cabinet 53 and the side wall 14 of the container 10, so as to facilitate air circulation and emission of hot airflow. The cooling fans 30 dissipate the heat inside the container 10 to the external environment.

What is claimed is:

1. A cabinet structure comprising:
   a base comprising a first side face, a second side face, and a third side face, the base having an included angle separately between the second side face and the first side face and between the third side face and the first side face, the base being fastened using the first side face, and a cross section of the base being a triangle; and
   two cabinets that are installed on and fastened to the second side face and the third side face respectively, the two cabinets being arranged in a V shape and forming an angle.

2. The cabinet structure of claim 1, wherein the cross section of the base being a triangle comprises the cross section of the base being an isosceles triangle, and areas of the second side face and the third side face are equal.

3. The cabinet structure of claim 1, wherein the cabinet comprises several installation frames, the installation frames being successively installed and fastened together to form the cabinet, and the installation frames being configured to hold an electronic apparatus.

4. The cabinet structure of claim 1, wherein the base is made of a metal material, the base is triangular prism-shaped.

5. A container data center comprising:
   a container;
   several cooling fans that are installed on a top of the container; and
   a cabinet that is installed in the container, the cabinet comprising a base and two cabinets, the base comprising a first side face, a second side face, and a third side face, the base having an included angle separately between the second side face and the first side face and between the third side face and the first side face, the base being fastened to a bottom of the container using the first side face, the two cabinets being installed on the second side face and the third side face respectively, the two cabinets being arranged in a V shape and forming an angle, an air flow channel being formed between the cabinet and the container, and a cross section of the base being a triangle.

6. The container data center of claim 5, wherein the container comprises a top wall, a bottom wall, and side walls, the top wall and the bottom wall are parallel to each other, the side walls are located between the top wall and the bottom wall and are coupled to the top wall and the bottom wall separately, the cooling fans all being installed on the top wall, the base being fastened to the bottom wall of the container using the first side face, the cabinet being in contact with and being supported by at least one side wall of the container, and an air flow channel being formed between the cabinet and at least one side wall of the container.

7. The container data center of claim 6, wherein the container is placed on a floor, at least one side wall of the container is provided with several air vents, the air vents being configured to be passed through and passed out by cold air, and the cold air entering the container through the air vents.

8. The container data center of claim 5, wherein the cross section of the base being a triangle comprises the cross section of the base being an isosceles triangle, and areas of the second side face and the third side face are equal.

9. The container data center of claim 5, wherein the cabinet comprises several installation frames, the installation frames being successively installed and fastened together to form the cabinet, and the installation frames being configured to hold an electronic apparatus.

10. The container data center of claim 5, wherein the base is made of a metal material, the base is triangular prism-shaped.

11. A cabinet structure comprising:
a base comprising a first side face, a second side face, and a third side face, the base having an included angle separately between the second side face and the first side face and between the third side face and the first side face, the base being fastened using the first side face, a cross section of the base being an isosceles triangle, and areas of the second side face and the third side face being equal; and
two cabinets that are installed on and fastened to the second side face and the third side face respectively, the two cabinets being arranged in a V shape and forming an angle.

12. The cabinet structure of claim 11, wherein the cabinet comprises several installation frames, the installation frames being successively installed and fastened together to form the cabinet, and the installation frames being configured to hold an electronic apparatus.

13. The cabinet structure of claim 11, wherein the base is made of a metal material, the base is triangular prism-shaped.

14. A container data center comprising:
a container;
several cooling fans that are installed on a top of the container; and
a cabinet structure that is installed in the container, the cabinet structure comprising a base and two cabinets, the base comprising a first side face, a second side face, and a third side face, the base having an included angle separately between the second side face and the first side face and between the third side face and the first side face, the base being fastened to a bottom of the container using the first side face, the cabinets being installed on the second side face and the third side face respectively, the cabinets being arranged in a V shape and forming an angle, an air flow channel being formed between the cabinet and the container, a cross section of the base being a isosceles triangle, and areas of the second side face and the third side face are equal.

15. The container data center of claim 11, wherein each of the two cabinets comprises several installation frames, the installation frames being successively installed and fastened together to form the cabinet, and the installation frames being configured to hold an electronic apparatus.

16. The container data center of claim 14, wherein the base is made of a metal material, the base is triangular prism-shaped.

* * * * *